US009608625B2

(12) United States Patent
Kunie et al.

(10) Patent No.: US 9,608,625 B2
(45) Date of Patent: Mar. 28, 2017

(54) SEMICONDUCTOR DEVICE AND SEMICONDUCTOR SYSTEM

(71) Applicant: Kabushiki Kaisha Toshiba, Minato-ku, Tokyo (JP)

(72) Inventors: Shuichi Kunie, Kawasaki Kanagawa (JP); Masanori Inoue, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/845,138

(22) Filed: Sep. 3, 2015

(65) Prior Publication Data

US 2016/0182041 A1 Jun. 23, 2016

(30) Foreign Application Priority Data

Dec. 22, 2014 (JP) .................................. 2014-259422

(51) Int. Cl.
| | |
|---|---|
| *H03K 17/687* | (2006.01) |
| *H03K 3/012* | (2006.01) |
| *G06F 1/32* | (2006.01) |
| *H03K 19/00* | (2006.01) |

(52) U.S. Cl.
CPC ......... *H03K 17/687* (2013.01); *G06F 1/3203* (2013.01); *H03K 3/012* (2013.01); *H03K 19/0008* (2013.01); *H03K 19/0016* (2013.01)

(58) Field of Classification Search
CPC ......... G06F 1/00; G06F 1/3203; H03K 17/00; H03K 17/04123; H03K 17/063; H03K 17/0822; H03K 17/687; H03K 19/00; H03K 19/0008; H03K 19/0016; H03K 2217/00; H03K 2217/0036; H03K 3/00; H03K 3/012

USPC .......................................................... 327/427
See application file for complete search history.

(56) References Cited

U.S. PATENT DOCUMENTS

| 7,586,325 B1 | 9/2009 | Andrews et al. |
| 2009/0160266 A1 | 6/2009 | Tatsumi et al. |
| 2009/0179688 A1* | 7/2009 | Igarashi ............... H03K 17/102 327/434 |

(Continued)

FOREIGN PATENT DOCUMENTS

| JP | 2010-258267 A | 11/2010 |
| JP | 2011-243794 A | 12/2011 |
| JP | 2013-125774 A | 6/2013 |

OTHER PUBLICATIONS

Partial European Search Report dated May 27, 2016 issued in counterpart European Application No. 15184047.7.

(Continued)

*Primary Examiner* — Lincoln Donovan
*Assistant Examiner* — David Mattison
(74) *Attorney, Agent, or Firm* — White & Case LLP

(57) ABSTRACT

According to one embodiment, a semiconductor device includes: a voltage line to which a first voltage is applied; a first circuit configured to operate by using the first voltage; and a second circuit configured to control a connection between the voltage line and the first circuit. The second circuit includes: at least one first switch circuit configured to connect the first circuit and the voltage line based on a first control signal; and a second switch circuit including a plurality of switch sections configured to connect the first circuit and the voltage line based on a plurality of second control signals different from the first control signal.

20 Claims, 12 Drawing Sheets

(56) References Cited

U.S. PATENT DOCUMENTS

| | | | |
|---|---|---|---|
| 2012/0126633 A1* | 5/2012 | Kosuge | H03K 19/0016 307/115 |
| 2012/0204046 A1* | 8/2012 | Baba | G06F 1/3231 713/323 |
| 2013/0222043 A1 | 8/2013 | Yamashita | |
| 2014/0015590 A1 | 1/2014 | Yoon et al. | |
| 2014/0167527 A1* | 6/2014 | Trochut | H03K 17/22 307/115 |
| 2015/0070087 A1* | 3/2015 | Fujita | G05F 1/46 327/541 |

OTHER PUBLICATIONS

European Search Report dated Sep. 13, 2016 issued in corresponding European patent application No. 15 184 047.7.

* cited by examiner

| | Domain1 (PD0) | Domain2 (PD1) | Domain3 (PD2) | Domain4 (PD3) |
|---|---|---|---|---|
| Mode1 | ON | ON | ON | ON |
| Mode2 | ON | ON | ON | OFF |
| Mode3 | ON | ON | OFF | ON |
| Mode4 | ON | ON | OFF | OFF |
| Mode5 | ON | OFF | OFF | OFF |

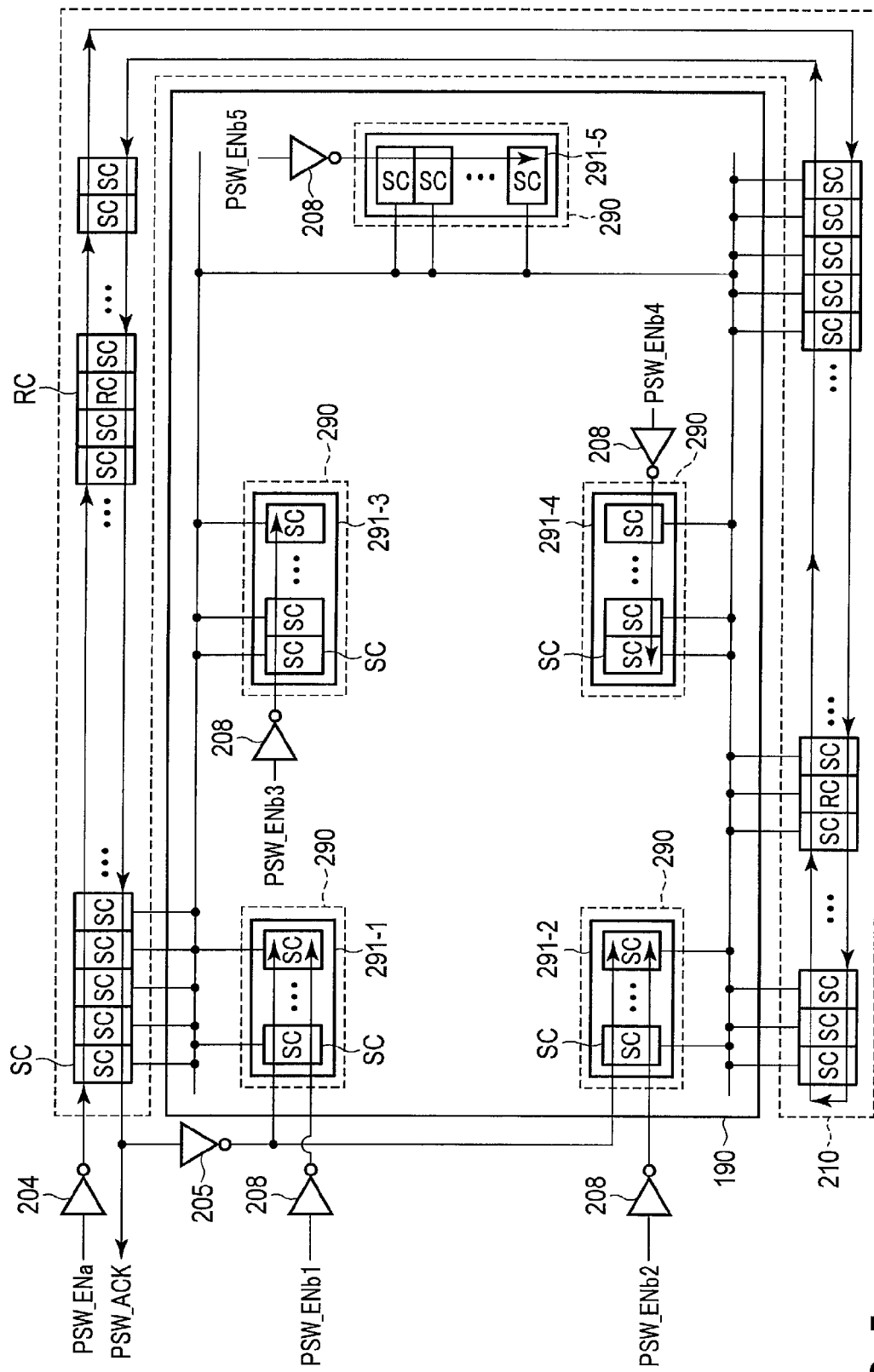
F I G. 5

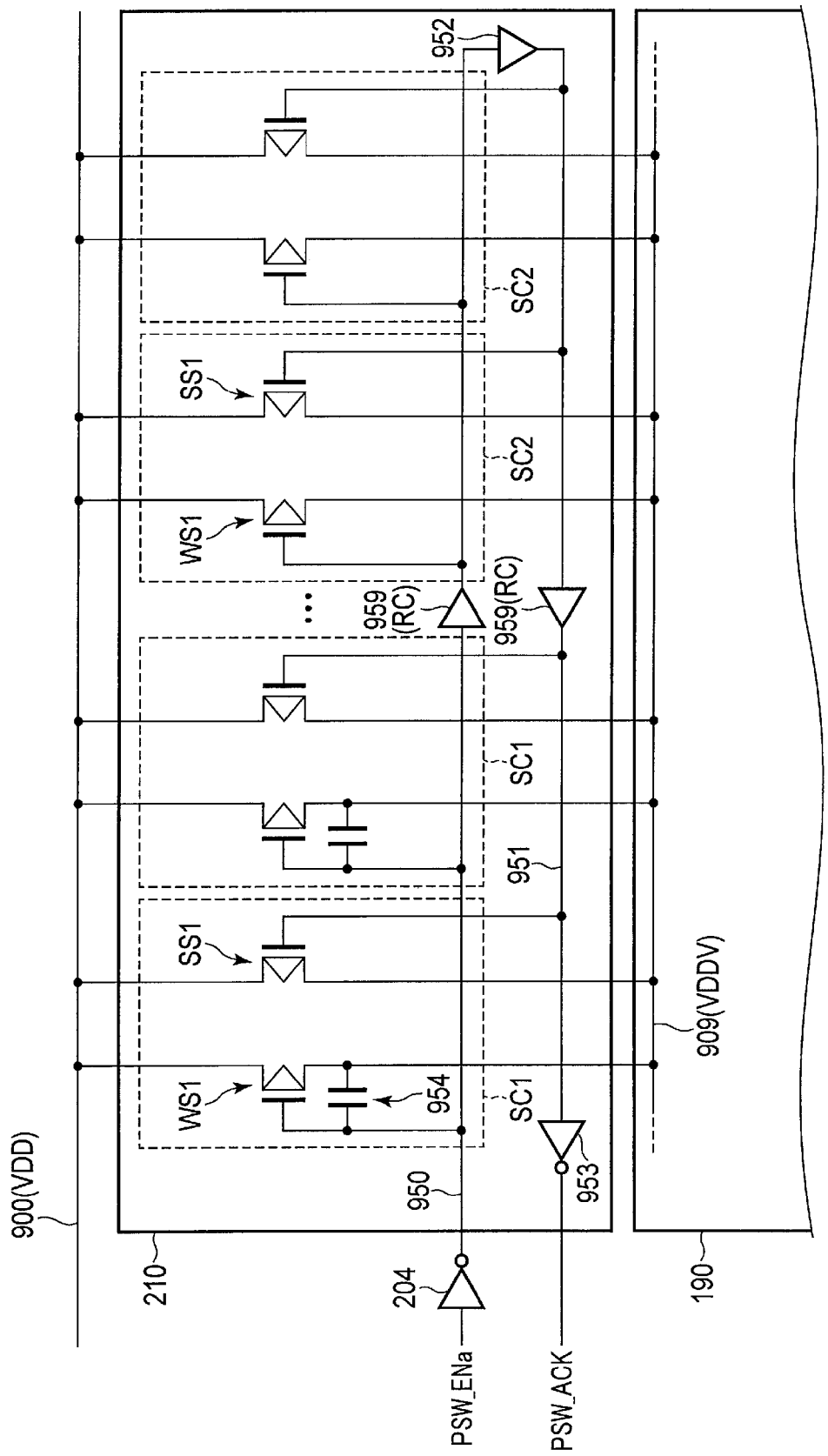
F I G. 6

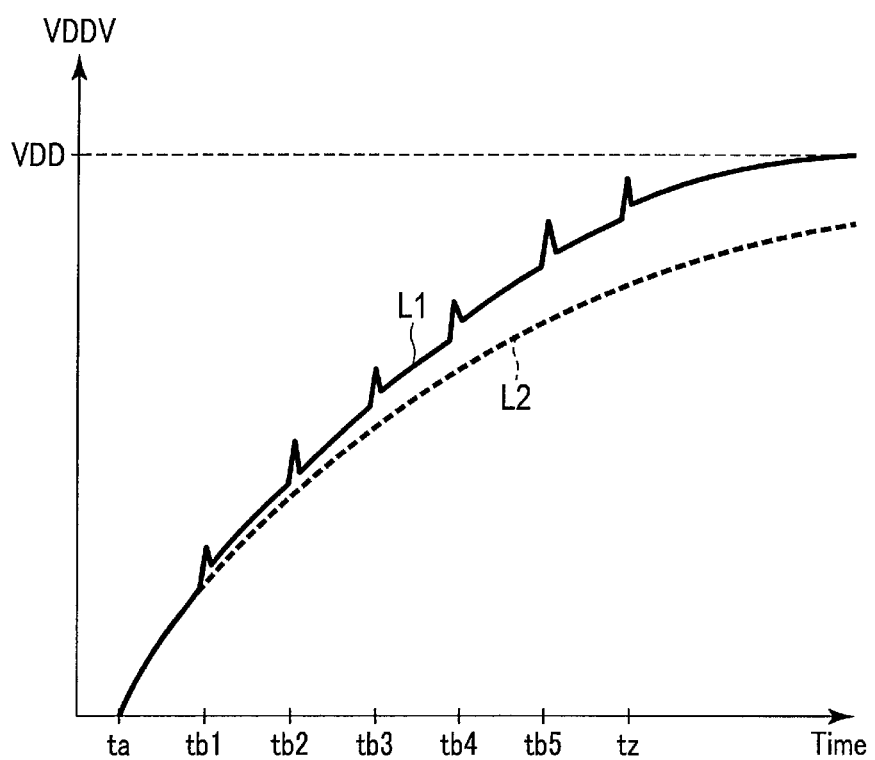
F I G. 9

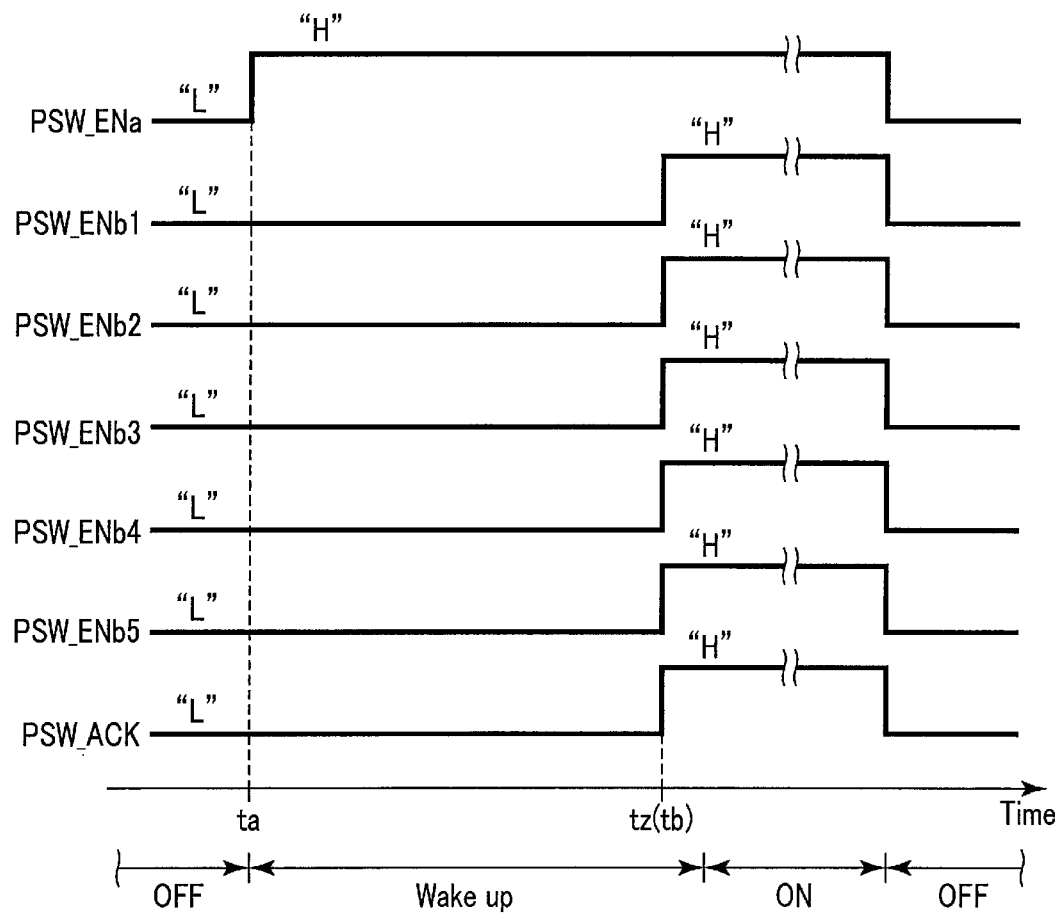
F I G. 10

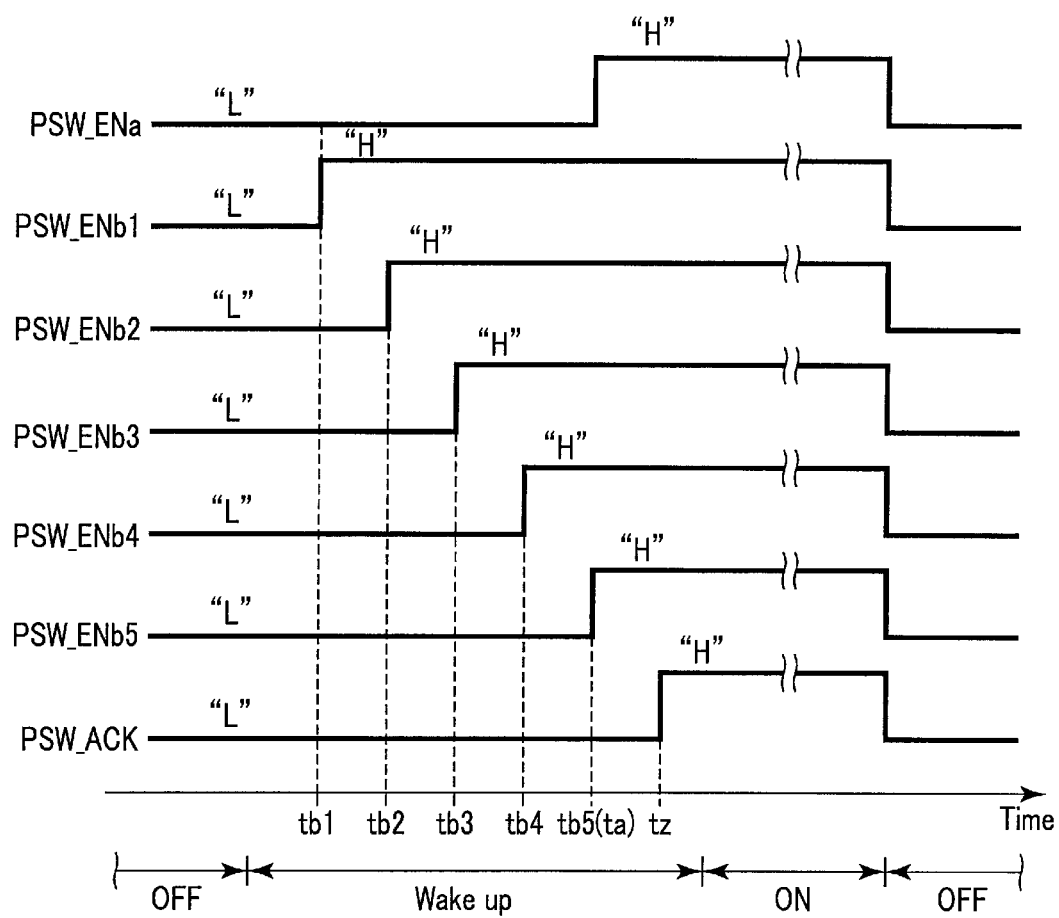
F I G. 12

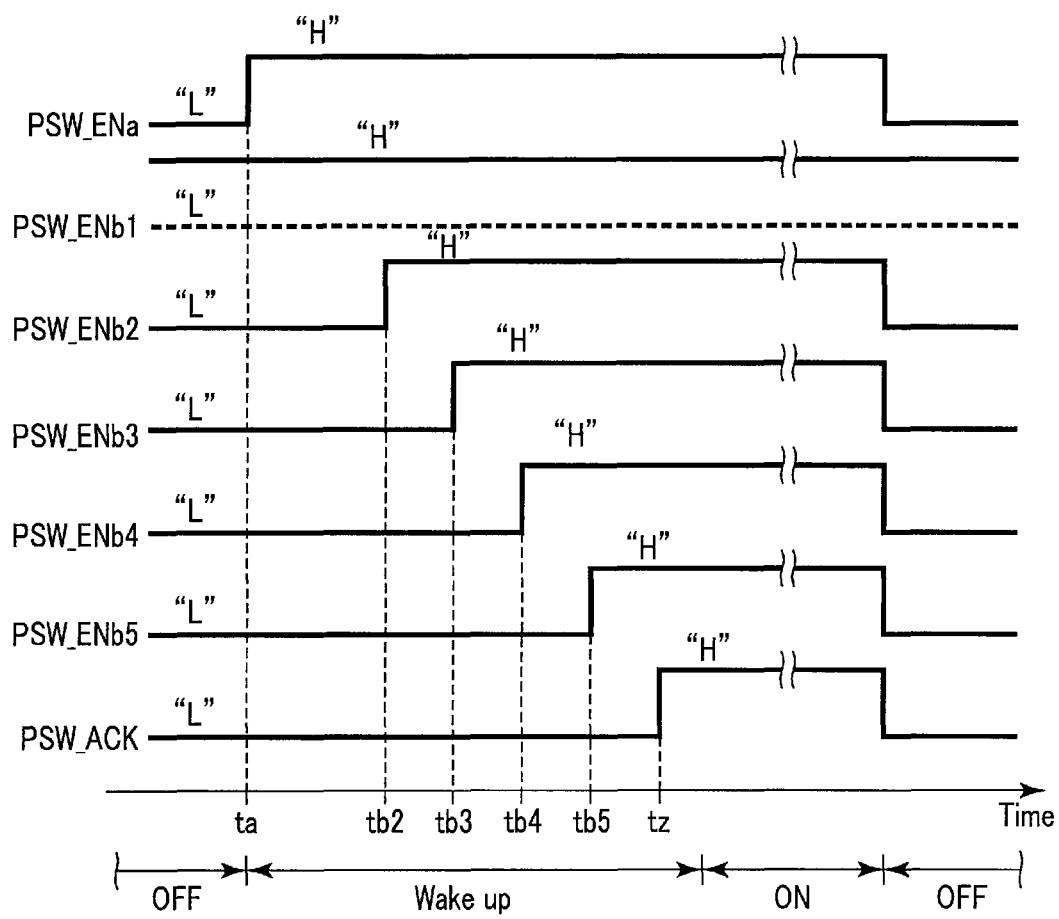
F I G. 13

SEMICONDUCTOR DEVICE AND SEMICONDUCTOR SYSTEM

CROSS-REFERENCE TO RELATED APPLICATIONS

This application is based upon and claims the benefit of priority from Japanese Patent Application No. 2014-259422, filed Dec. 22, 2014, the entire contents of which are incorporated herein by reference.

FIELD

Embodiments described herein relate generally to a semiconductor device and a semiconductor system.

BACKGROUND

In recent years, efforts have been made to reduce power consumption of semiconductor integrated circuits.

A technique for reducing the power consumption of a semiconductor integrated circuit involves shutting down the supply of power to a circuit block in the semiconductor integrated circuit that is not driven.

The shutdown of power to the circuit block is performed by a switch circuit arranged between the circuit block and a power supply line (or a ground line).

BRIEF DESCRIPTION OF THE DRAWINGS

FIG. 5 is a schematic depicting a configuration example of the switch circuit in the semiconductor integrated circuit of the embodiment;

FIG. 6, FIG. 7A, and FIG. 7B are schematics depicting a configuration example of the switch circuit in the semiconductor integrated circuit of the embodiment;

FIG. 8 and FIG. 9 are diagrams illustrating an operation example of the switch circuit in the semiconductor integrated circuit of the first embodiment, FIG. 10 is a diagram illustrating an operation example of the switch circuit in the semiconductor integrated circuit of the second embodiment;

FIG. 12 and FIG. 13 are diagrams illustrating an operation example of the switch circuit in the semiconductor integrated circuit of the second embodiment.

DETAILED DESCRIPTION

Figure 1:
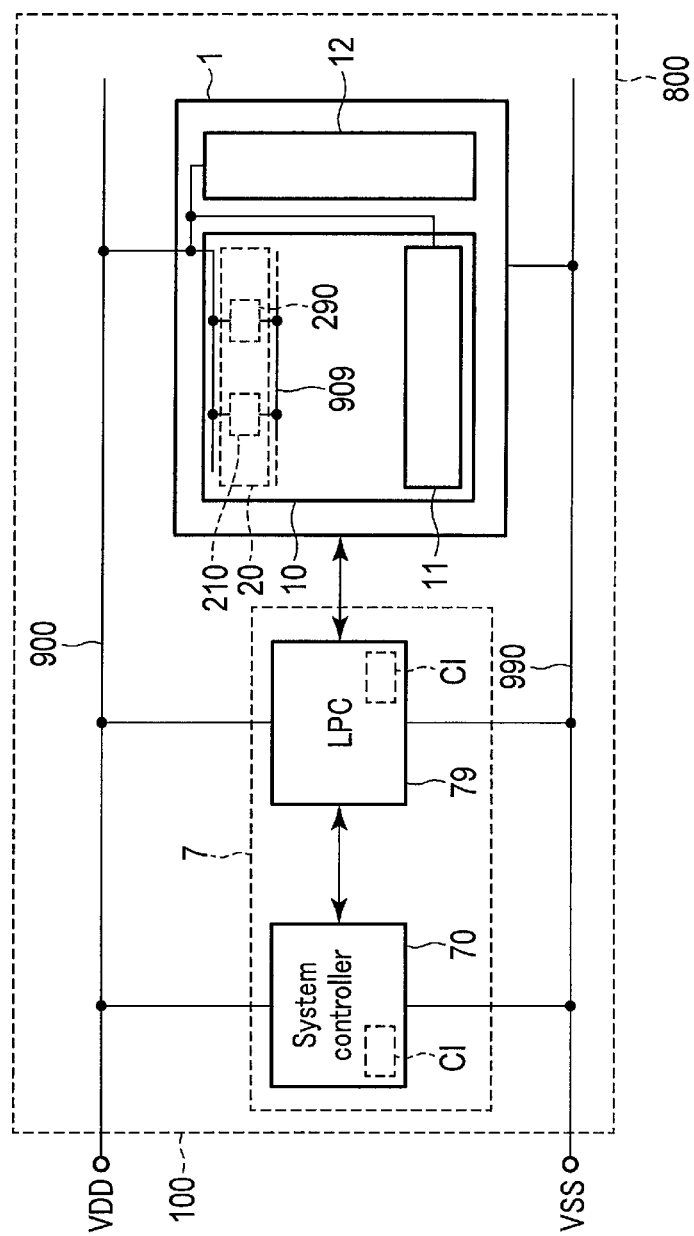
FIG. 1 is a schematic depicting a general configuration of a semiconductor system including a semiconductor integrated circuit of an embodiment.

The present embodiment will be described below in detail with reference to the drawings. In the description below, elements having the same functions and configurations are denoted by the same reference numerals, and duplicate descriptions are omitted. In the embodiment described below, when reference numerals (for example, switch elements and control signals) with numbers or letters for differentiation at the end of the numeral are not distinguished from one another, representations with the trailing numbers omitted are used as reference numerals.

In general, according to one embodiment, a voltage line to which a first voltage is applied; a first circuit configured to operate by using the first voltage; and a second circuit configured to control a connection between the voltage line and the first circuit. The second circuit includes: at least one first switch circuit configured to connect the first circuit and the voltage line based on a first control signal; and a second switch circuit including a plurality of switch sections configured to connect the first circuit and the voltage line based on a plurality of second control signals different from the first control signal.

EMBODIMENT

With reference to FIGS. 1 to 13, a semiconductor integrated circuit and a control method for the semiconductor integrated circuit according to an embodiment will be described.

(1) First Embodiment

With reference to FIGS. 1 to 9, a configuration example of a semiconductor integrated circuit of a first embodiment will be described.

(a) Basic Configuration (a-1) General Configuration

FIG. 1 is a diagram depicting a semiconductor system including the semiconductor integrated circuit of the present embodiment.

For example, as depicted in FIG. 1, the semiconductor integrated circuit (semiconductor device) 1 of the present embodiment is provided in a semiconductor system 800. The semiconductor system 800 including the semiconductor integrated circuit 1 of the present embodiment is mounted in various types of electronic equipment such as a portable terminal, a wireless communication device, and a personal computer.

The semiconductor system 800 includes a system controller 70 and a low power controller 79, in addition to the semiconductor integrated circuit 1 of the present embodiment.

The system controller 70 manages and controls all the components in the semiconductor system 800.

The low power controller 79 controls some operations of the semiconductor integrated circuit 1, and turn-on and -off of a power supply in conjunction with the control by the system controller 70. The low power controller 79 also transfers processing results from the semiconductor integrated circuit 1 to the system controller 70 or to another device. For simplification of description, at least one of the system controller 70 and the low power controller 79 is referred to as an external control device 7.

In the semiconductor system 800, the semiconductor integrated circuit 1, the system controller 70, and the low power controller 79 are directly or indirectly connected together so as to be able to transmit and receive signals to and from one another. The semiconductor system 800 is coupled directly or indirectly to another device external to the semiconductor system 800 via a cable, wireless communication, or the Internet.

The semiconductor integrated circuit 1, the system controller 70, and the low power controller 79 are each connected between two voltage lines 900 and 990.

A power supply voltage VDD is applied to a first voltage line (hereinafter referred to as a power supply line) 900. A ground voltage VSS is applied to a second voltage line (hereinafter referred to as a ground line) 990. A voltage that allows the semiconductor system 800 to be driven is supplied to circuits (devices) 1, 70, and 79 via the power supply line 900 and the ground line 990.

As depicted in FIG. 1, the semiconductor integrated circuit (hereinafter also referred to as an LSI device) 1 is a SoC (System on Chip) device.

The LSI device 1 includes a plurality of circuits (macros and circuit blocks). The LSI device 1 includes a circuit (circuit block) 10 for which turn-on and -off of the power supply (power supply and power shutdown) is controlled, and a circuit 11 for which turn-on and -off of the power supply is not controlled. The LSI device or the circuit 10 may be internally provided with a circuit 12 including a storage element and a logic element to which the power supply voltage VDD is preferably constantly supplied.

For example, the LSI device 1 in the present embodiment includes a communication processing circuit 11, a memory circuit 12, and a CPU (Central Processing Unit) 10.

The communication processing circuit 11, for example, executes various types of signal processing for connection (and interface) control, and data transmission and reception between another external device (server, access point, or communication terminal) and the semiconductor system 800, based on wireless communication standards such as WiFi or Bluetooth. The communication processing circuit 11 may have a wireless communication function.

The memory circuit 12 stores data from outside the LSI device 1, data generated inside the LSI device 1, and setting information and control information for the circuits in the LSI device 1. The memory circuit 12 includes a memory device such as an SRAM, a flip flop circuit, and a latch circuit.

The CPU (internal control circuit) 10 manages and controls operations of the circuits 11 and 12 in the LSI device 1. The CPU 10 can notify the system controller 70 and the low power controller 79 of the operating status of the inside of the LSI device 1. The CPU 10 executes calculation processes on signals from outside the LSI device 1, and executes calculation processes on signals generated inside the LSI device 1.

The CPU 10 includes a plurality of circuit blocks. The CPU 10 executes management and control of circuits, control of data transfer, interface processing, and various types of signal processing based on the functions of the plurality of circuit blocks. The circuit blocks execute logical calculation and signal processing in order to perform various types of processing of the CPU 10.

The CPU 10 is driven in one of a plurality of modes according to the operating status of the LSI device 1 in order to reduce the power consumption of the LSI device 1. The CPU 10 allows one or more of the plurality of circuit blocks in the CPU 10 to be set to a non-driven state according to the operation mode set for the CPU 10.

In connection with the operating states of the system and circuits of the present embodiment, a driven state is hereinafter referred to as an on state or a run state, and the non-driven state is hereinafter referred to as an off state or a sleep state.

In the run state, the circuit blocks execute various processes. In the sleep state (also referred to as a wait state or power shutdown state), the supply of power (voltage/current) to the circuit blocks is shut down. In the present embodiment, a state where data (for example, setting information for the CPU 10 and information in a cache) continues to be retained with no calculation process or data transfer executed is referred to as a retention state.

The CPU 10 includes a switch circuit 20 to set the operating state of an internal circuit of the CPU 10 to the run state or the sleep state.

The switch circuit 20 controls the supply of power (for example, the power supply voltage VDD) to the CPU 10. The switch circuit 20 that controls the supply of power (power supply voltage/current) is hereinafter referred to as a power switch circuit 20.

The power switch circuit 20 supplies the power supply voltage VDD to a circuit block that executes processing (circuit block to be set to the driven state). Consequently, the circuit block is set to the run state (on state).

When a state of the circuit block is shifted from the run state to the sleep state according to the operating status of the CPU 10, the power switch circuit 20 allows an internal power supply line 909 in the circuit block in the CPU 10 to be electrically separated from the power supply line 900.

Thus, one of the plurality of circuit blocks which is electrically separated from the power supply line 900 is set to the sleep state (off state). As a result, a portion of the power consumption of the CPU 10 which corresponds to the circuit block in the sleep state is reduced.

When at least one of the plurality of circuit blocks is shifted from the sleep state to the run state, the power switch circuit 20 makes the circuit block to be shifted to the run state electrically continuous with the power supply line 900, based on control by an external control device. Consequently, the power supply voltage VDD is supplied to the circuit block to be driven, which returns to the run state. In the present embodiment, an operation in which the circuit block is shifted from the sleep state to the run state (return operation or restarting) is also referred to as wakeup (or a wakeup operation).

The power switch circuit 20 in the CPU 10 in the LSI device 1 of the present embodiment includes a plurality of switch blocks (switch circuits) 210 and 290.

(a-2) Basic Configuration of the Power Switch Circuit

Figure 2:
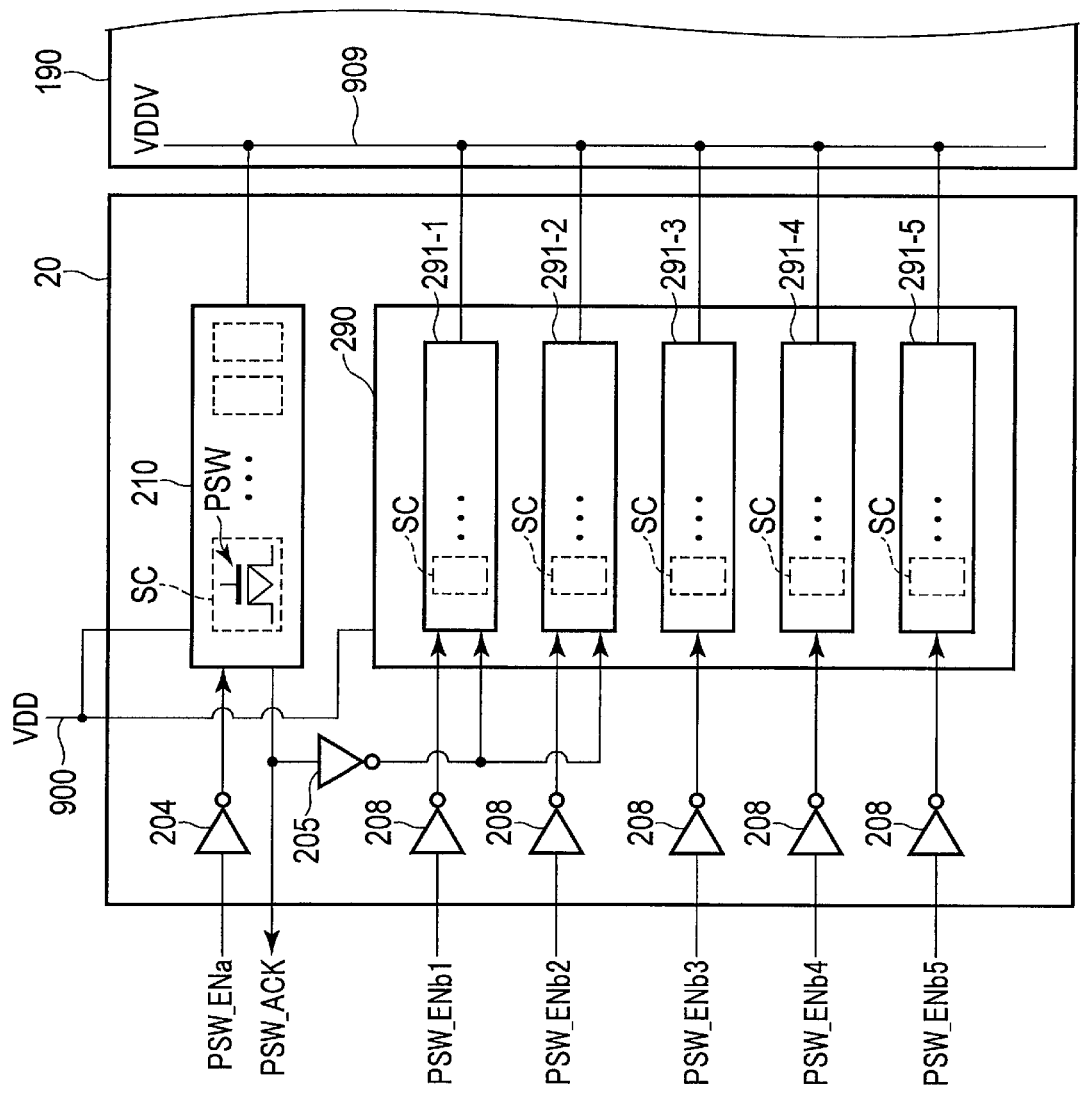
FIG. 2 is a schematic depicting a configuration example of a switch circuit in the semiconductor integrated circuit of the embodiment.

FIG. 2 is a diagram schematically illustrating the power switch circuit used for the LSI device of the present embodiment.

As depicted in FIG. 2, in the present embodiment, the power switch circuit 20 includes a first switch block 210 and a second switch block 290. The switch blocks 210 and 290 are connected between the power supply line 900 and an internal power supply line (also referred to as a virtual power supply line) 909 in a circuit block 190 in the CPU 10. In the circuit block 190, elements and modules are connected to the internal power supply line 909. A plurality of internal power supply lines 909 may be provided in one circuit block 190.

Each of the switch blocks 210 and 290 includes one or more switch cells SC arranged in parallel. Each of the switch cells SC includes one or more switch elements PSW. The switch element PSW is, for example, a P channel field-effect transistor (hereinafter referred to as a P-type transistor). A current path through the switch element PSW is connected between and in series with the power supply lines 900 and 909.

The first switch block 210 can continuously supply the power supply voltage VDD to the circuit block 190 at a somewhat constant ramp-up speed when the supply of the power supply voltage to the circuit block 190 is started (for example, when the circuit block shifts from the off state to the on state).

The first switch block 210 receives a first control signal PSW_ENa from an external control device 7. The first switch block 210 sets the switch element PSW to the on state or the off state based on the first control signal PSW_ENa. For example, the first control signal PSW_ENa is supplied to the switch element (P-type transistor) PSW in the switch cell SC via an inverter 204.

The control signal PSW_ENa may be generated in the CPU 10 based on the control by the external control device 7. At least one of the system controller 70 and the low power controller 79 generates the control signal PSW_ENa.

The first switch block 210 outputs a notification signal PSW_ACK to the outside of the first switch block 210. The notification signal (completion notification signal) PSW_ACK is a signal indicating that control of the first switch block 210 (turn-on or -off of the switch element) has completed.

The second switch block 290 includes a plurality of switch sections (switch groups) 291-1 to 291-5. A plurality of switch sections 291 is provided for one circuit block 190. The plurality of switch sections 291-1 to 291-5 is connected in parallel with each other between the power supply line 900 and the internal power supply line 909 in the circuit block 190. Each of the plurality of switch sections 291-1 to 291-5 includes one or more switch cells SC connected between the power supply line 900 and the internal power supply line 909.

In the present embodiment, the second switch block 290 receives the notification signal PSW_ACK from the first switch block 210, for example, via the inverter 205. The notification signal PSW_ACK controls at least one of the plurality of switch sections 291-1 to 291-5.

Consequently, the power switch circuit 20 allows operations of the second switch block 290 (activation and inactivation) to be performed inside the CPU 10 in conjunction with operations of the first switch block 210 without the wait for the control from the external control device 7 based on the notification signal PSW_ACK.

The second switch block 290 receives a plurality of second control signals PSW_ENb1 to PSW_ENb5 from the external control device 7. One of the plurality of second control signals PSW_ENb1 to PSW_ENb5 is supplied to one of the plurality of switch sections 291-1 to 291-5, for example, via a inverter 208.

At least one of the system controller 70 and the low power controller 79 generates the control signals PSW_ENb1 to PSW_ENb5.

The control signals PSW_ENb1 to PSW_ENb5 may be generated in the CPU 10 based on the control by the external control device 7.

The plurality of switch sections 291-1 to 291-5 can be, for example, activated (on state) or inactivated (off state) at different timings in accordance with the plurality of control signals PSW_ENb1 to PSW_ENb5.

By way of example, when the circuit block (in this case, the internal circuit of the CPU 10) wakes up, the switch sections 291-1 to 291-5 are set to the on state at different timings. In this case, in accordance with the order that the switch sections 291-1 to 291-5 are set to the on state, current paths formed between the internal power supply line 909 and the power supply line 900 are formed in the switch sections 291-1 to 291-5.

Thus, in the second switch block 290, for example, when the circuit block 190 wakes up, the independent switch sections 291 allow the power supply voltage (power) to be supplied to the internal power supply line 909 in the circuit block 190 in a time sharing manner (at different timings).

In the present embodiment, how the power switch circuit 20, particularly the second switch block 290, is controlled can be adjusted and selectively controlled via software or firmware based on a user's specification, standards for the semiconductor system 800 to which the CPU 10 (LSI device 1) is applied, or the results of a test process for obtaining appropriate driving conditions for the LSI device 1.

Control information (setting information) CI indicative of a control scheme for the power switch circuit 20 is, for example, stored in a memory area in the system controller 70 or the low power controller 79. The control information CI can be externally rewritten by the user via software (program) or firmware. The control information CI for the power switch circuit 20 may be stored in a memory circuit in the LSI device 1 or in a memory area in the CPU 10.

(b) Specific Example

With reference to FIGS. 3 to 7, a configuration example of the power switch circuit in LSI device 1 of the present embodiment will be more specifically described.

(b-1) Internal Configuration

Power Supply Shutdown Area

Figures 3, 4:
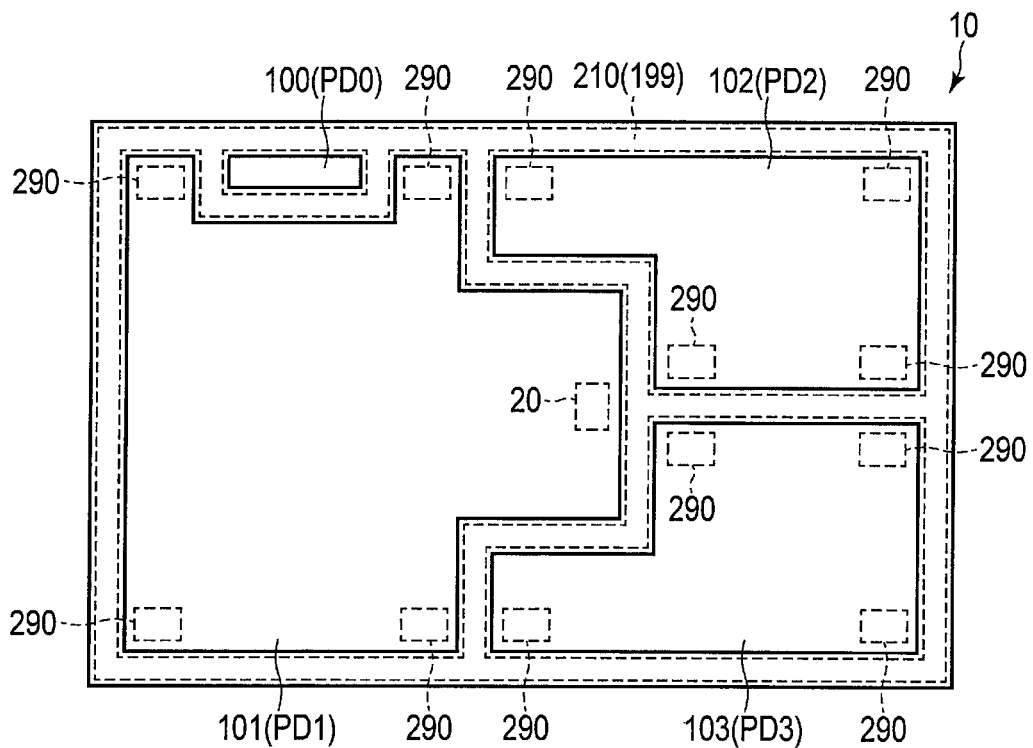
FIG. 3 is a diagram depicting an example of an internal configuration of the semiconductor integrated circuit of the embodiment.
FIG. 4 is a diagram illustrating an operation example of the semiconductor integrated circuit.

FIG. 3 illustrates an example of an internal configuration (layout) of the CPU 10 included in the LSI device 1 of the present embodiment. A circuit in which a plurality of circuit blocks described below is provided may be a circuit other than the CPU.

As depicted in FIG. 3, the CPU 10 includes a plurality of circuit blocks 100, 101, 102, and 103.

Each of the circuit blocks 100 to 103 belong to different power supply systems (power supply shutdown area and voltage division area). For clarification of description, circuit blocks belonging to different power supply systems (and areas in which the circuit blocks are provided) are referred to as power domains. The power domain may be a circuit area with a certain logical function like a calculator such as an ALU, or a circuit area defined regardless of the logical function.

Each of the power domains 100 to 103 have a circuit (element or module) and a function that allow processing of the CPU 10 to be executed.

For example, the power domain (PD0) 100 is a port area. The power domain 100 includes a plurality of ports. The ports include, for example, I/O ports (control ports) used for a retention flip flop circuit (hereinafter referred to as an RFF), a retention SRAM (hereinafter referred to as an RSRAM), a retention latch, an AOB (Always On Buffer), and an isolation cell. The I/O ports in the power domain 100 are used to receive and output a control signal for power-on and -off of cells such as an RFF and a control signal for management of the power-on and -off of the cells. It is also acceptable that the I/O ports for a retention circuit such as the RFF, the RSRAM, or a retention latch are not provided in the power domain 100.

The RFF, the RSRAM, and the retention latch temporarily retain data such as the setting information for the CPU 10. The AOB is a buffer to which the power supply voltage is normally supplied so as to enable the control signal to be transmitted and received even when the power domain is in the off state. The isolation cell is a circuit that performs control so that an indefinite signal from the circuit switched from the off state to the on state (power domain) is prevented from propagating to another circuit.

To allow a signal to be transmitted to and received from the I/O port, for example, an I/O circuit such as a buffer circuit (not depicted in the drawings) is provided in the power domain 100. The I/O port is connected to an I/O circuit.

Each of the power domains 101 to 103 includes a plurality of modules that allows a predetermined signal process and a predetermined calculation process to be executed.

Each of power domains (PD1, PD2, and PD3) 101, 102, and 103 among the plurality of power domains executes a predetermined signal process and a predetermined calculation process according to the operating statuses of the semiconductor system and the LSI device 1. The power domain (PD1) 101 is a circuit block that can be set to an off state, for example, only when the power domains (PD2 and PD3) 102 and 103 are in the off state. When the supply of the power supply voltage VDD to the power domain 101 is shut down, the whole CPU 10 except for the I/O ports is set to the sleep state.

The number of the power domains in the CPU 10 is not limited to four.

When an RFF/RSRAM, an AOB, and the like are provided in the power domain 101, 102, or 103, a port area to which the power supply voltage VDD is normally applied may be provided inside the power domain 101, 102, or 103.

Example of the Operation Mode

The CPU 10 including the plurality of power domains 100 to 103 is driven in a plurality of operation modes according to the operating status of the semiconductor system 800 and the LSI device 1.

The CPU 10 allows the power domains 100 to 103 on which no signal processing is executed to be set to the non-driven state (sleep mode) according to the operation mode of the CPU 10.

FIG. 4 is a diagram illustrating an example of a correspondence between the operation mode of the CPU 10 and the operating state of each power domain.

As depicted in FIG. 4, the CPU 10 is set to one of the operation modes that corresponds to the operating status of the semiconductor system. The operation mode of the CPU 10 is continually switched according to the operating status of the semiconductor system 800. For example, the CPU 10 has five operation modes.

Each of the power domains 100 to 103 is set to one of the on state (run state) and the off state (sleep state) according to the operation mode set for the CPU 10.

For example, as depicted in FIG. 3, the power domain (PD0) 100 provided with a port is set to the on state in all of the operation modes 1 to 5 in order to transmit and receive signals and to maintain the functions of the circuit.

When the CPU 10 is set to the sleep state (the operation mode of the CPU 10 is in a mode 5), the three power domains 101 to 103 are set to the off state.

Moreover, in accordance with the operation mode of the CPU 10 (for example, when the operation mode is one of the modes 2 to 4), one or more of the power domains 101 to 103 in which no signal processing is executed are set to the off state.

For example, in switching the power domain from the off state to the on state, the semiconductor system of the present embodiment allows only one power domain to be woken up or allows a plurality of power domains to be simultaneously woken up.

In this manner, controlling each of the power domains inside the CPU 10 enables the supply of the power supply voltage VDD to the CPU 10 to be controlled.

(b-2) Internal Configuration of the Power Switch Circuit

The power switch circuit 20 supplies power to the power domain and shuts down the power supply to the power domain to control the off state and on state of each of the power domains 100 to 103.

For example, the power switch circuit 20 is provided in at least one of a boundary area 199 between the power domains 100 to 103 and an inside of the power domain 100 to 103. Consequently, the power domains 100 to 103 are separated from one another to allow turn-on and -off (supply of the power supply voltage) of the power domains 100 to 103 to be independently controlled.

For the power domains 100 to 103 in the on state, the power switch circuit 20 supplies the power supply voltage VDD to the power domains 100 to 103. For the power domains 100 to 103 in the off state, the power switch circuit 20 electrically separates the power domains 100 to 103 from the power supply line 900 to shut down the supply of the power supply voltage VDD to the power domains 100 to 103.

FIG. 5 schematically depicts a configuration example of the power switch circuit in a certain power domain. The layout of the components depicted in FIG. 5 is schematically illustrated, and the present embodiment is not limited to the layout depicted in FIG. 5.

In the LSI device 1 in the present embodiment, the power switch circuit 20 includes two types of switch blocks 210 and 290.

In the present embodiment, the switch block 210 has a configuration and a control scheme both of which are referred to as a slew-rate control type, and the switch block 290 has a configuration and a control scheme both of which are referred to as a time-sharing control type.

In the present embodiment, for clarification of description, the first switch block 210 is referred to as the slew-rate control switch block 210, and the second switch block 290 is referred to as the time-sharing control switch block.

Internal Configuration of the Slew-Rate Control Switch Block

As depicted in FIG. 5 (and FIG. 3), in the slew-rate control switch block 210, the plurality of switch cells SC are, for example, arranged around the power domain 190 (101 to 103). However, in the slew-rate control switch block 210, the switch cells SC may be provided inside the power domain 190 as long as the switch cells SC enable design rules for the power domain 190 and the switch block 210 to be met, and enable the desired potential to be applied to the inside of the power domain 190.

The switch cells SC are connected between the power supply line 900 and the internal power supply line 909 as current paths that connect the internal power supply line 909 to the power supply line 900.

The plurality of switches SC is connected to a common control signal line. The switch cells SC connected to the common control signal line are also referred to as a switch string.

In the slew-rate control switch block 210, the control signal PSW_ENa is supplied though a first end of the arranged switch cells (switch string) SC. The control signal PSW_ENa propagates on the control signal line from the one end of the arranged plurality of switch cells (a first end of the switch string) toward the other end of the arranged plurality of switch cells (a second end of the switch string). The control signal PSW_ENa having reached the other end of the switch string propagates on the control signal line in the opposite direction from the other end toward the one end of the switch string.

A buffer, an inverter, and a repeater cell RC may be provided in the switch string so as to connect to the control signal line at predetermined intervals of the switch cells SC.

FIG. 6 is an equivalent circuit diagram depicting a configuration example of switch cells in the power switch circuit in the present embodiment.

FIG. 6 depicts an example of an internal configuration of switch cells in the slew-rate control switch block 210.

As depicted in FIG. 6, the switch cells SC includes at least two types of switch elements WS1 and SS1 (PSW). One of the two switch elements, the switch element WS1, is hereinafter referred to as the weak switch WS1, and the other switch SS1 is hereinafter referred to as the strong switch SS1.

For example, a driving force for the P-type transistor WS1 serving as the weak switch WS1 is weaker than a driving force for the P-type transistor SS serving as the strong switch SS1. In other words, the element size (for example, the effective channel width/channel length) of the P-type transistor WS1 is smaller than the element size of the P-type transistor SS1.

After the weak switch WS1 with the weak driving force is turned on, the strong switch SS1 with the strong driving force is turned on. This allows an internal voltage VDDV of the power domain to increase slowly. As described above, the weak switch WS1 and the strong switch SS1 are utilized to supply the power supply voltage VDD to the power domain 190, thus reducing a flow-through current (rush current) through the power domain 190 (and hard macros).

The two P-type transistors WS1 and SS1 are connected together in parallel between the power supply line 900 and the internal power supply line 909.

For the weak switch WS1, one of a source and a drain (for example, the source) of the P-type transistor WS1 is connected to the power supply line 900. The other of the source and drain (for example, the drain) of the P-type transistor WS1 is connected to the internal power supply line 909.

For the strong switch SS1, one of a source and a drain (for example, the source) of the P-type transistor SS1 is connected to the power supply line 900. The other of the source and drain (for example, the drain) of the P-type transistor SS1 is connected to the internal power supply line 909.

A gate of the P-type transistor WS1 is connected to a control signal line 950. A gate of the P-type transistor SS1 is connected to a control signal line 951. The control signal line 950 is connected to an output terminal of the inverter 204. The control signal line 950 is connected to the control signal line 951 via a buffer 952.

For example, a buffer 959 as the repeater cell RC is connected to the control signal lines 950 and 951. The buffer 959 reduces an excessive increase in signal delay to a value proportional to a line length.

For example, the slew-rate control switch block 210 includes two types of switch cells. Switch cells SC1 are different from switch cells SC2 in circuit configuration.

The switch cell SC1 includes a capacitor (for example, a capacitor with a metal-oxide-metal structure) 954. The capacitor 954 is connected to the P-type transistor (weak switch) WS1. One end of the capacitor 954 is connected to the gate of the P-type transistor WS1, and the other end of the capacitor 954 is connected to the source/drain (in this case, the drain) of the P-type transistor on the power domain (virtual power supply line) side.

Capacitive coupling of the capacitor 954 suppresses a decrease in the potential between the gate and drain resulting from an increase in the drain potential of the weak switch WS1. This allows adjustment of a ramp-up speed of the weak switch WS1.

In the slew-rate control switch block 210, the switch cell SC2 includes no capacitor. The internal configuration of the switch cell SC2 is substantially the same as the internal configuration of the switch cell SC1 except for the absence of a capacitor.

For example, the switch cell SC1 with the capacitor 954 is provided on an input side for the control signal PSW_ENa (the first end of the switch string). The switch cell SC2 with no capacitor is arranged contiguously with the switch cell SC1 along an extending direction of the control signal lines 950 and 951.

The control signal PSW_ENa output from the external control device 7 is supplied to a control terminal (gate of the transistor) for a switch of each switch cell SC to control turn-on and -off of the switch cell (switch element).

When the signal level of the control signal PSW_ENa is at the L (Low) level, an H (High) level signal is supplied to the gates of the P-type transistors WS1 and SS1 via the inverter 204. In this case, P-type transistors WS1 and SS1 are in the off state (disabled state or inactivated state).

When the signal level of the control signal PSW_ENa is the H (High) level (when the control signal PSW_ENa is asserted), an L level signal is supplied to the gates of the P-type transistors WS1 and SS1 via the inverter 204. In this case, the P-type transistors WS1 and SS1 are in the on state (enable state or activated state).

The control signal PSW_ENa is hereinafter also referred to as the enable signal.

The enable signal PSW_ENa propagates from the control signal line 950 to the control signal line 951 via the buffer 952. For example, the buffer 952 amplifies the signal level.

In the slew-rate control switch block 210, the weak switches WS1 are sequentially set to the on state from the switch cells SC1, located on the input side for the enable signal PSW_ENa, toward the switch cells SC2, located on the terminal of the switch block 210. Then, the strong switches SS1 are sequentially set to the on state from the switch cells SC2, located on the terminal (buffer 952 side), toward the switch cells SC1, located on the input side for the enable signal (inverter 204 side).

Each of the control signal lines 950 and 951 includes capacitive components and resistive components. At a speed corresponding to a time constant based on the capacitive components and the resistive components, the signal level of the enable signal PSW_ENa shifts from the H level to the L level. At a speed corresponding to the transition speed of the signal level, the P-type transistors WS1 and SS1, which serve as switch elements, gradually change from the off state to the on state.

A current (drain current) with a magnitude corresponding to the driving forces and gate voltages of the P-type transistors WS1 and SS1 flows from the power supply line 900 to the internal power supply line 909 in the power domain 190 via the switch cells SC1 and SC2 to gradually increase the potential of the internal power supply line 909.

In an initial state in the wakeup operation where the potential of the internal power supply line 909 is low, the P-type transistors WS1 and SS1 are not in the complete on state, and output currents from the transistors WS1 and SS1 are relatively small. Thus, a current (the amount of current) flowing from the power supply line 900 to the internal power supply line 909 via the switch cells SC is small, suppressing the rush current.

The capacitive components included in the control signal lines 950 and 951 are, for example, the capacitors 954 connected to the control signal lines 950 and 951 and the gate capacitances of the transistors WS1 and SS1 connected to the control signal lines 950 and 951 and line capacitances. The resistive components included in the control signal lines 950 and 951 are, for example, the on resistance of the transistors in the inverters or buffers connected to the control signal lines 950 and 951 and the line resistance.

The number of the switch cells SC1 and SC2 in the slew-rate control switch block 210 corresponding to a certain power domain is set so as to set desired values (for example, values determined with the magnitude of the rush current and a startup period for the power domain taken into account) for a time constant that determines a transition speed for the signal levels of the control signal lines 950 and 951 (capacitive components and resistive components of the control signal lines), and a change speed for the potential VDDV of the internal power supply line in the power domain corresponding to the time constant.

As described above, the switch elements WS1 and SS1 of the switch cells SC are gradually set to the on state to allow the switch cells SC to supply the internal power supply line 909 with drain currents with magnitudes corresponding to the driving states of the P-type transistors serving as the switch elements WS1 and SS1. The supply of the drain currents to the internal power supply line 909 results in charging of the internal power supply line 909, and the potential of the internal power supply line 909 increases in an analog manner (continuously) until the potential of the internal power supply line 909 becomes the same as the potential of the power supply line 900, that is, the VDDV.

The above-described control of the switch elements WS1 and SS1 from the off state to the on state continuously starts up (turns on) the switches in the slew-rate control switch block 210 at a certain constant ramp-up speed and flattens currents generated by turn-on of the switches. As a result, during a recovery operation (wakeup) of the power domain, the power switch circuit 20 including the slew-rate control switch block 210 allows a possible flow-through current to be suppressed.

The slew-rate control switch block 210 outputs the notification signal PSW_ACK to the outside of the switch block 210 in association with the enable signal PSW_ENa. For example, the notification signal PSW_ACK is a signal generated by outputting the enable signal PSW_ENa on the control signal line 951 via the inverter 953.

The above-described circuit configuration and control scheme allows the slew-rate control switch block 210 to increase the internal voltage VDDV in the power domain 190 in an analog manner.

A plurality of slew-rate control switch blocks 210 may be provided for one power domain 190. The plurality of slew-rate control switch blocks 210 uses different control signals (enable signals) to control the supply of power to the one power domain 190 (101 to 103) and the shutdown of the power. The plurality of slew-rate control switch blocks 210 may independently output the notification signal PSW_ACK. For example, a plurality of switch strings controlled independently of one another function as a plurality of slew-rate control switch blocks 210.

Configuration Example of the Time-Sharing Control Switch Block

The time-sharing control switch block 290 includes the plurality of switch sections 291-1, 291-2, 291-3, 291-4, and 291-5.

As depicted in FIG. 5 (and FIG. 3), the switch sections 291-1 to 291-5 are distributively arranged inside the power domain 190. However, the switch sections 291-1 to 291-5 may be arranged in an outer peripheral area of the power domain 190 for which the supply of the power supply voltage VDD and the shutdown of the power are controlled (for example, in the boundary area 199 between the power domains).

FIG. 5 illustrates an example in which the five switch sections 291-1 to 291-5 are provided. However, the number of switch sections in the time-sharing control switch block 290 may be four or less or six or more according to a circuit scale of the power domain 190.

The switch sections 291-1 to 291-5 are controlled by control signals (enable signals) PSW_ENb1 to PSW_ENb5, respectively, from the external control device 7. Independent enable signals PSW_ENb1 to PSW_ENb5 are supplied to the switch sections 291-1 to 291-5, respectively.

The time-sharing control switch block 290 may be controlled using, in addition to the enable signal PSW_ENa, the notification signal PSW_ACK from the slew-rate control switch block 210.

For example, the notification signal PSW_ACK from the slew-rate control switch block 210 is supplied to one or more of the plurality of switch sections 291.

In the present embodiment, the notification signal PSW_ACK is supplied to the two switch sections 291-1 and 291-2. Besides the enable signals PSW_ENb1 and PSW_ENb2, the switch sections 291-1 and 291-2 use the notification signal PSW_ACK as a control signal for turn-on and -off of the switch cells (switch elements).

The notification signal PSW_ACK is supplied to the switch sections 291-1 and 291-2 via the inverter 205.

In the time-sharing control switch block 290, the configuration of the switch cells in the switch section may vary with the switch section.

Figure 7A:
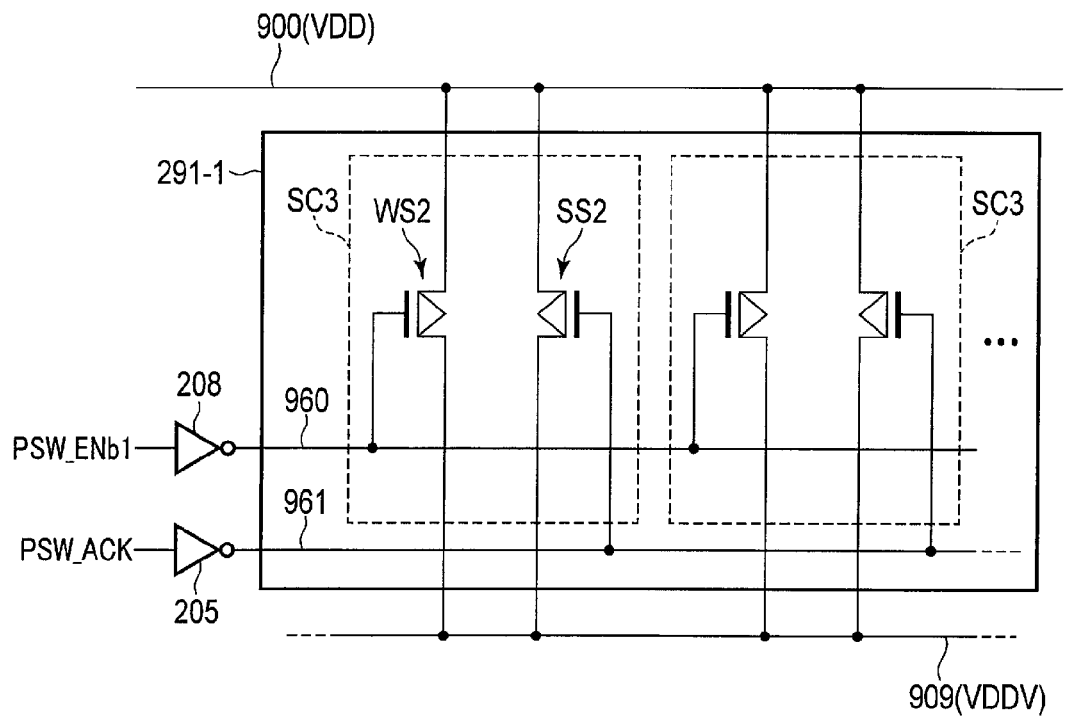
Figure 7B:
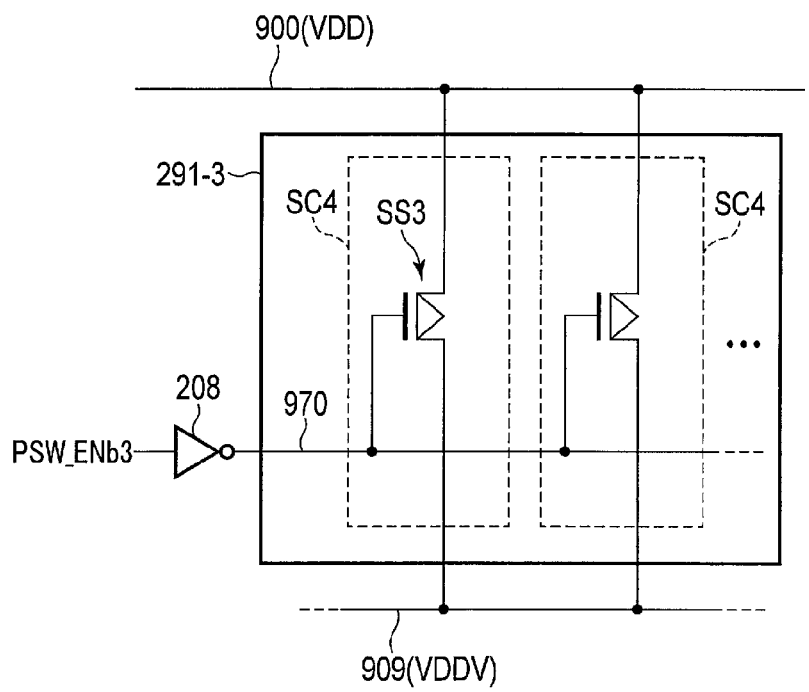

FIG. 7A and FIG. 7B are equivalent circuit diagrams depicting a configuration example of the switch cells in the power switch circuit.

FIG. 7A and FIG. 7B depict an example of an internal configuration of the switch section 291 in the time-sharing control switch block 290.

As depicted in FIG. 7A, in the switch section 291-1 (and the switch section 291-2) to which the notification signal PSW_ACK is supplied, a switch cell SC3, like the switch cell in FIG. 6, includes a weak switch WS2 and a strong switch SS2.

A current path of the P-type transistor WS2 serving as the weak switch WS1 is connected between the power supply line 900 and the internal power supply line 909. A gate of the P-type transistor WS2 is connected to the control signal line 960.

A current path of the P-type transistor SS2 serving as the strong switch SS2 is connected between the power supply line 900 and the internal power supply line 909. A gate of the P-type transistor SS2 is connected to the control signal line 961. The control signal line 961 is separated from the control signal line 960, and the two control signal lines 960 and 961 are independent of each other.

The enable signal PSW_ENb1 is supplied to the gate of the P-type transistor WS2 serving as the weak switch WS2. The notification signal PSW_ACK is supplied to the gate of the P-type transistor SS2 serving as the strong switch SS2.

As described above, in the switch cell SC3 of a part of the time-sharing control switch block 290, turn-on and -off of the weak switch WS2 is controlled by the enable signal PSW_ENb1. Turn-on and -off of the strong switch SS2 may be controlled by the notification signal PSW_ACK.

FIG. 7B depicts a switch cell configured differently from the switch cell in FIG. 7A.

As depicted in FIG. 7B, the time-sharing control switch block 290 may use a switch cell including one type of switch element.

In the switch sections 291-3 to 291-5 to which the enable signals PSW_ENb3 to PSW_ENb5 are supplied, a switch cell SC4 does not include the weak switch and includes only a strong switch SS3.

In the switch cell SC4, a current path of the P-type transistor SS3 serving as the strong switch SS3 is connected between the power supply line 900 and the internal power supply line 909. A gate of the P-type transistor SS3 is connected to a control signal line 970.

As described above, in the switch cell SC4 of a part of the time-sharing control switch block 290, turn-on and -off of the P-type transistor SS3 is controlled by the enable signal PSW_ENb.

The switch element in each of the switch cells SC3 and SC4 allows the internal power supply line 909 to be supplied with a current corresponding to the driving force and driving state of the P-type transistor serving as the switch element. Consequently, the internal power supply line 909 is charged to increase the potential of the internal power supply line 909.

A timing (time) when the switch section 291 is activated and the number and characteristics of the switch cells in the switch section 291 are designed as needed according to a voltage control characteristic of the slew-rate control switch block 210 (for example, a speed at which the internal power supply line is charged by the switch block 210) and an allowable value for the rush current.

For example, if a large amount of current from a large number of switch cells flows into the internal power supply line 909 in the initial state where the internal power supply line 909 has a low potential, a large rush current may be generated. Therefore, the number of switch cells in those of the plurality of switch sections 291 which are activated first (when the internal voltage VDDV is low) if the switch sections are activated at different timings (in this case, the switch section 291-1 controlled by the enable signal PSW_ENb1), is preferably smaller than the number of switch cells in the subsequently activated switch sections in order to suppress the rush current. The number of the switch cells in the switch section 291 increases in order of activation of the switch section.

Switch cells with capacitors depicted in FIG. 6 may be used as the switch cells in the time-sharing control switch block 290.

The above-described circuit configuration and control scheme allow the time-sharing control switch block 290 to, for example, digitally (discontinuously or discretely) increase the internal voltage VDDV of the power domain 190 based on the control by the plurality of switch sections 291.

For example, when the power domain (circuit block) is shifted from the off state (sleep state) to the on state (run state), the plurality of switch sections 291 in the time-sharing control switch block 290 starts the supply of the power supply voltage VDD to the power domain 190 at different timings in parallel with the supply of the power supply voltage VDD by the slew-rate control switch block 210, based on the plurality of control signals PSW_ENb and the notification signal PSW_ACK.

At the timing when the switch section 291 is activated, a current from the switch section 291 increases a current supplied to the internal power supply line 909. Thus, this power supply improves a speed at which the internal potential increases compared to the supply of power (voltage/current) using only the slew-rate control switch block 210. Consequently, the time-sharing control switch block 290 may be operated in a supplementary manner for the supply of power by the slew-rate control switch block 210.

As described above, the plurality of switch blocks 210 and 290 with the different control schemes (power supply schemes) performs power supply to increase the speed of the recovery operation of the circuit blocks.

The power switch circuit 20 including the slew-rate control switch block 210 and the time-sharing control switch block 290 is not limited to the power switch circuit in the CPU 10. The power switch circuit 20 in FIGS. 3 to 7 is applicable to a power switch circuit for the whole LSI device 1, or a power switch circuit in a circuit other than the CPU in the LSI device 1.

The configurations of the switch cells depicted in FIG. 6, FIG. 7A, and FIG. 7B are illustrative. Switch cells other than the switch cells configured as depicted in FIG. 6, FIG. 7A, and FIG. 7B may be used for the slew-rate control switch block 210 and the time-sharing control switch block 290.

Moreover, buffers or inverters may be connected to I/O terminals of the switch blocks 210 and 290 and the switch section 291 provided that the switch blocks 210 and 290 and the switch section 291 can perform predetermined control.

(c) Advantageous Effects

In the LSI device, as the number of times that the circuit block (power domain) is powered on and off increases, the overhead of the time needed to switch the circuit block from the off state to the on state starts to affect the operation of the semiconductor system. As a result, the semiconductor system may fail to perform an amount of work (signal processing) per unit time, causing a malfunction of the system (breakdown of the system).

When the time needed to switch the circuit block from the off state to the on state is shortened in order to increase the amount of work per unit time, an IR drop caused by an excessive rush current may occur in a circuit block to be woken up and in another circuit. A significant IR drop may cause malfunctioning of a circuit block switched from the off state to the on state or of a circuit other than that circuit block.

Thus, measures are taken against the malfunction of the system so as to reduce opportunities to shut down the supply of the power supply voltage (power/current) to the circuit block to the extent that the system will not malfunction, and reduce possible overhead. However, in this case, the LSI and the semiconductor system may fail to achieve expected reduced power consumption (particularly reduced leakage power).

The power switch circuit 20 in the LSI device of the present embodiment includes the plurality of switch blocks 210 and 290.

For the switch block 210, the internal voltage of the circuit block is gradually increased so as not to cause a rush current. For the other switch block 290, the internal voltage is rapidly increased to shorten the period of supply of the power supply voltage (power). In this manner, in the switch circuit 20 in the LSI device of the present embodiment, the two switch blocks 210 and 290 with the different control schemes for the supply of the power supply voltage, supply the power supply voltage to the circuit block 190 to be woken up.

Consequently, in the LSI device of the present embodiment, the power switch circuit 20 of the present embodiment allows the operating state of the circuit block to be switched from the off state to the on state at high speed, with an excessive rush current and an IR drop caused by the rush current suppressed.

As a result, the LSI device including the power switch circuit of the present embodiment meets a demand for the shutdown of the power supply voltage expected for power saving while achieving operations required for the system, enabling a reduction in power consumption.

As described above, the semiconductor integrated circuit of the present embodiment enables a reduction in the power consumption of the circuit (and the system) and thus an increase in the speed of operation.

(d) Operation Example

Figure 8:
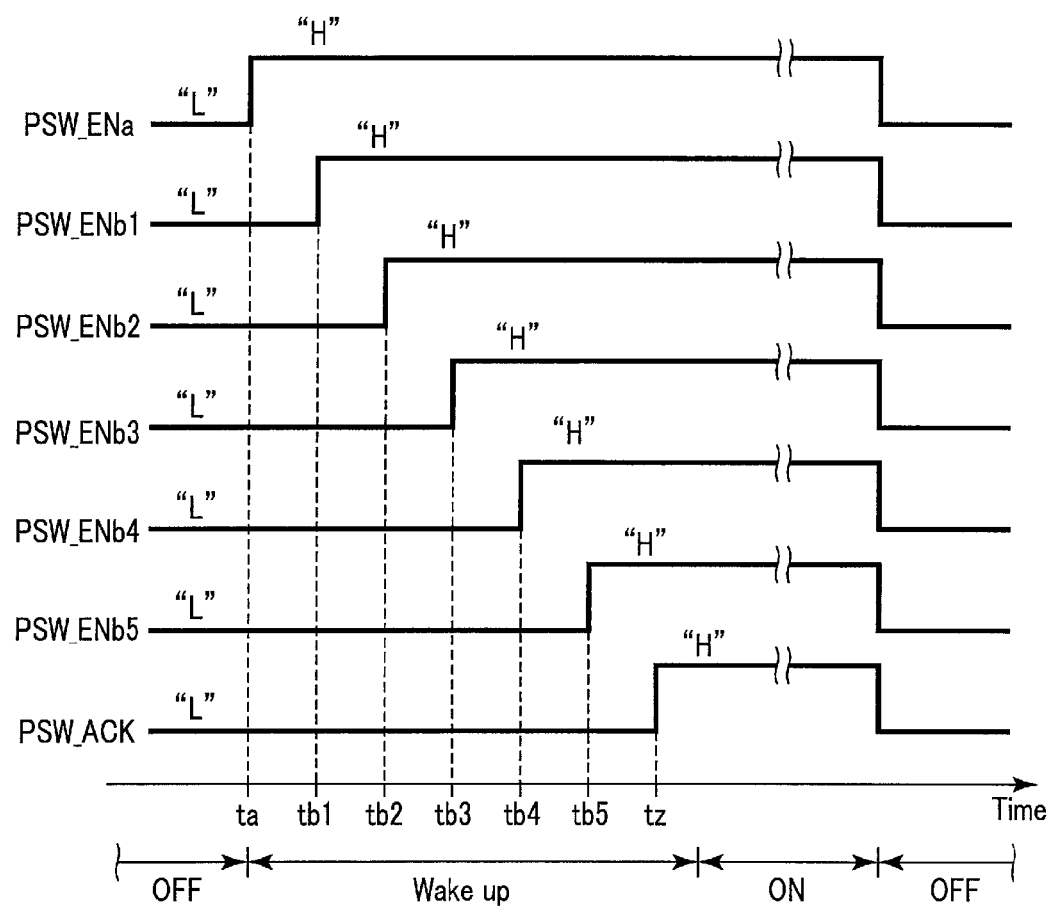

With reference to FIG. 8 and FIG. 9, an operation example (a method for controlling the LSI device) of the semiconductor integrated circuit of the present embodiment will be described. With also reference to FIGS. 1 to 7, operations of the power switch circuit included in the semiconductor integrated circuit will be described.

FIG. 8 is a timing chart illustrating the operation example of the LSI device of the present embodiment. FIG. 8 illustrates timings for changes in control signals occurring when a certain power domain (circuit block) 190 in the CPU 10 returns from the off state (sleep state or non-driven state) to the on state (run state or driven state).

As depicted in FIG. 8, when the power domain 190 of the CPU 10 is in the off state, the external control device 7 (at least one of the system controller 70 and the low power controller 79) sets the enable signal (control signal) PSW_ENa or PSW_ENb to the L level.

In the slew-rate control switch block 210 and the time-sharing control switch block 290, when the L level enable signal PSW_ENa or PSW_ENb is supplied to the switch cells SC in FIG. 6, FIG. 7A, and FIG. 7B, the signal level of the enable signal PSW_ENa or PSW_ENb is inverted from the L level to the H level by the inverter 204 or 208.

The H level signals PSW_ENa and PSW_ENb turn off the switch elements WS1, WS2, SS1, and SS3 of the P-type transistor.

At this time, the slew-rate control switch block 210 is in the non-driven state, and thus the signal level of the notification signal PSW_ACK is the L level. Thus, in the switch section 291-1 or 291-2 of the time-sharing control switch block 290 to which the notification signal PSW_ACK is supplied, the switch SS2 of the P-type transistor is in the off state.

As described above, the switch elements WS and SS in the off state electrically separate the power domain 190 from the power supply line 900 to set the power domain 190 to the off state.

When signal processing using the power domain 190 in the off state based on a request from the external control device 7, the operation mode of at least one power domain 190 shifts from the off state to the on state (wakes up).

Thus, as depicted in FIG. 8, the external control device 7 controls the signal level of the enable signal PSW_ENa or PSW_ENb for the power switch circuit 20 corresponding to the power domain 190 to be woken up.

Consequently, the power switch circuit 20 starts supplying the power supply voltage VDD to the power domain 190 in the off state.

The external control device 7 asserts the enable signal PSW_ENa for the slew-rate control switch block 210. Thus, the signal level of the enable signal PSW_ENa shifts from the L level to H level at a point in time (time instant) ta.

The signal level of the enable signal PSW_ENa is inverted by the inverter 204. In the switch block 210, the L level enable signal PSW_ENa is supplied to each of the switch cells SC1 and SC2 via the control signal line 950. Consequently, the weak switch WS1 of the two switch elements in the switch cell SC is turned on.

Moreover, after the weak switch WS1 is turned on, the strong switch SS1 is turned on by the L level enable signal PSW_ENa on the control signal line 951.

The supply of the power supply voltage VDD by the slew-rate control switch block 210 increases the internal voltage VDDV of the power domain 190 at a speed corresponding to the ramp-up speed based on the characteristics of the plurality of switch elements WS1 and SS1 (time constant and driving power). As a result, the generation of a current in the power domain is flattened to suppress an excessive large flow-through current.

After the enable signal PSW_ENa is asserted, the plurality of enable signals PSW_ENb for the time-sharing control switch block 290 is asserted, for example, by the external control device 7. Consequently, in parallel with the supply of the power supply voltage VDD by the slew-rate control switch block 210, the time-sharing control switch block 290 starts supplying the power supply voltage VDD to the power domain 190 to be woken up.

In the example illustrated in FIG. 8, the signal levels of the plurality of enable signals PSW_ENb1 to PSW_ENb5 shifts from the L level to the H level at different timings (points in time tb1 to tb5). Consequently, the plurality of switch sections is sequentially set to the on state.

For example, at point in time tb1 succeeding point in time ta, the enable signal PSW_ENb1 shifts from the L level to the H level. At point in time tb2 succeeding point in time tb1, the enable signal PSW_ENb2 is set to the H level. The L level signals PSW_ENb1 and PSW_ENb2 are supplied via the inverter 208 to the switch cells SC3 in the switch sections 291-1 and 291-2 at different timings.

In the switch sections 291-1 and 291-2 controlled by the enable signals PSW_ENb1 and PSW_ENb2, the switch cells SC3 in the switch sections 291-1 and 291-2 includes the weak switch WS2 and the strong switch SS2. The switch turned on by the enable signal PSW_ENb1 and PSW_ENb2 is the weak switch WS2. The strong switch SS2 is a switch element controlled by the notification signal PSW_ACK. Thus, the strong switch SS1 is not turned on at point in time tb1 or tb2.

At point in time tb3, the enable signal PSW_ENb3 is set to the H level. The signal level of the enable signal PSW_ENa is inverted by the inverter 208, and the L level signal is supplied to the switch cell SC4 in the switch section 291-3.

In the switch section 291-3 controlled by the enable signal PSW_ENb3, the switch cell SC4 includes no weak switch. In the switch cell SC4, the strong switch SS3 is controlled by the enable signal PSW_ENb3. Therefore, the enable signal PSW_ENb3 turns on the strong switch SS3.

At point in time tb4, the enable signal PSW_ENb4 is set to the H level. At point in time tb5, the enable signal PSW_ENb5 is set to the H level.

At points in time tb4 and tb5, the enable signals PSW_ENb4 and PSW_ENb5 respectively are sequentially supplied to the switch sections 291-4 and 291-5 with the signal levels thereof inverted from the H level to the L level.

As is the case with the switch section 291-3, the switch cells SC3 in the switch sections 291-4 and 291-5 include no weak switch. Therefore, the enable signals PSW_ENb4 and PSW_ENb5 turn on the strong switches SS3 in the switch sections 291-4 and 291-5 at different timings.

During a period from point in time tb3 to point in time tb5, the notification signal PSW_ACK is at the L level. Therefore, when the strong switches SS3 in the switch sections 291-3 to 291-5 are turned on, the strong switches SS1 in the switch sections 291-1 and 291-2 are in the off state.

After the asserted enable signal PSW_ENb is supplied to the switch section 291 in the time-sharing control switch block 290, at point in time tz, the slew-rate control switch block 210, having completed turn-on of the switch elements, outputs the asserted notification signal PSW_ACK. The signal level of the notification signal PSW_ACK shifts from the L level to the H level. The timing for the output of the asserted notification signal PSW_ACK is preset by firmware (and software) for the external control device 7 or a delay circuit added to the switch block 290.

The H level notification signal PSW_ACK is output from the slew-rate control switch block 210. The notification signal PSW_ACK is supplied to the external control device 7 and to the time-sharing control switch block 290.

The signal level of the notification signal PSW_ACK is inverted from the H level to the L level by the inverter 205, and the L level signal PSW_ACK is supplied to the strong switches SS2 in the switch sections 291-1 and 291-2. Consequently, the strong switches SS2 in the switch sections 291-1 and 291-2 are turned on.

The switch sections 291 in the time-sharing control switch block 290 are activated at temporally divided timings (at different timings). The switch sections 291 independently start and execute the supply of the power supply voltage to the power domain with a plurality of switch sections.

The power domain is powered on (for example, at or after point in time tz), and then, the external control device 7 transmits, for example, a control signal allowing recovery from the sleep state to the CPU 10.

As described above, in the operation of recovering the power domain (circuit block) in the off state to the on state, the control of the power switch circuit 20 included in the LSI device of the present embodiment is completed by the control signals PSW_ENa and PSW_ENb from the external control device 7 and the notification signal PSW_ACK generated inside the power switch circuit 20. Consequently, the power supply voltage is supplied to the power domain via the power switch circuit 20.

When the operating state of the power domain is switched from the on state to the off state, the switch blocks 210 and 290 are set to the off state (inactivated state) at a time by the control signals PSW_ENa and PSW_ENb.

The wakeup operation for one power domain has been described. However, the above-described operation may allow the wakeup operation to be simultaneously performed on the plurality of power domains 101 to 103 at the same time.

In addition, each of the times (time instants) ta, tb1 to tb5 and tz, for example, represents a value from a starting point (for example, a start of the wakeup operation) to a transition point of signal level of the control signal. For example, each of the times ta, tb1 to tb5 and tz is preset based on at least one of a design rule and a result of a test process. Each of the times ta, tb1 to tb5 and tz may be dynamically changes based on the monitoring result of the potential of the internal power supply line during the wakeup operation.

FIG. 9 is a diagram depicting changes in the internal voltage of the power domain during the recovery operation in the present operation example. The horizontal axis corresponds to time, and the vertical axis corresponds to the internal voltage (potential of the virtual power supply line) VDDV of the power domain.

In FIG. 9, a solid line L1 represents changes in the internal voltage of the power domain during the recovery operation performed by the power switch circuit of the present embodiment. In FIG. 9, a dashed line L2 represents, as a comparative example, changes in the internal voltage of the power domain during a recovery operation performed by an LSI device using a power switch circuit including only a slew-rate control switch block.

As depicted in FIG. 9, at point in time ta, the slew-rate control switch block 210 starts supplying a voltage. At points in time tb1 to tb5, the switch sections 291 in the time-sharing control switch block 290 are sequentially set to the on state.

At a timing when the switch section 291 is turned on, a current from the switch section 291 in the on state is supplied to the internal power supply line 909 separately from a current from the slew-rate control switch block 210. The additional charging of the internal power supply line 909 by the switch section 291 increases the rate of increase in the internal voltage VDDV at the timing when the switch section 291 is turned on in comparison to the rate of increase in potential when power is supplied only by the slew-rate control switch block 210.

As a result of the supply of power by the switch section in the time-sharing control switch block 290 in addition to the supply of power by the slew-rate control switch block 210, the time for the internal voltage VDDV of the power domain to reach a target voltage value (power supply voltage VDD) can be shortened. Consequently, the amount of time until the start of driving of the power domain to be woken up (the amount of time to switch the power domain from the off state to the on state) is reduced.

As described above, in the power switch circuit 20 including the slew-rate control switch block 210 and the time-sharing control switch block 290 in the present embodiment, the slew-rate control switch block 210 changes the internal voltage in an analog manner, and the time-sharing control switch block 290 also changes the internal voltage VDDV in a supplementary manner.

Throughout the period until the arrival of the internal voltage VDDV of the power domain at the power supply voltage VDD, the internal voltage increases under the control of the slew-rate control switch block 210. Therefore, in the present embodiment, when the operating state of the power domain 190 switches from the off state to the on state, no excessive rush current is generated.

Even if the internal voltage VDDV increases at the timing when the switch section 291 is turned on, the magnitude of a rush current generated at this time falls within the range of an allowable value controlled by the number of the switch cells SC in the switch section 291. Thereby, the occurrence of significant noise and leakage currents are suppressed.

As described above, the method for controlling the power switch circuit 20 in the LSI device of the present embodiment allows the power domain 190 to be switched from the off state to the on state for restarting, in the condition where the occurrence of an excessive rush current and the overhead of the processing time, which is caused by the time to switch the circuit block between the on state and the off state, are suppressed.

As a result, the LSI device of the present embodiment enables a reduction in power consumption and an increase in the speed of the device.

(2) Second Embodiment

With reference to FIGS. 10 to 13, an LSI device including a semiconductor device (power switch circuit) of a second embodiment will be described.

In the LSI device of the present embodiment, the power switch circuit includes two switch blocks based on different control schemes to allow a control scheme (a scheme in which a power supply voltage is supplied to a power domain) for the power switch circuit 20 to be changed in accordance with a user's specifications and standards for the LSI/system.

Control information CI in the external control device 7 is rewritten by software or firmware to change the control scheme for the power switch circuit 20.

In the power switch circuit 20, a timing for assertion of an enable signal indicated in the control information CI is changed to enable a change in a scheme in which the power supply voltage is supplied to the power domain, using the same circuit configuration as that in the first embodiment.

For example, the time-sharing control switch block 290 may be controlled using only the control signal PSW_ENb from the external control device 7 in accordance with the user's specifications and the standards applied to the semiconductor system.

As described below, in accordance with the user's specifications and the standards for the semiconductor system, the LSI device of the present embodiment allows the supply of the power supply voltage to the power domain to be controlled without depending on the supply of power by the time-sharing control switch block 290, and using only the slew-rate control switch block 210.

An operation example of the LSI device of the present embodiment will be described using FIG. 10.

FIG. 10 is a timing chart illustrating the operation example of the LSI device of the present embodiment. FIG. 10 illustrates timings for changes in control signals in the power switch circuit.

For example, for the power switch circuit 20 included in the LSI device of the present embodiment, the operation of the power switch circuit 20 can be changed by changing the control information CI for the power switch circuit 20 via software (or firmware) in accordance with the user's specifications and the LSI standards.

For example, in the LSI device of the present embodiment, the time-sharing control switch block 290 in the power switch circuit 20 allows the plurality of switch sections 291 to be set to the on state at a time by changing the control scheme via software in accordance with the user's specifications and the LSI standards.

As depicted in FIG. 10, the external control device 7 shifts the enable signal PSW_ENa for the slew-rate control switch block 210 from the L level to the H level.

When the operation in the switch block 210 is complete, the slew-rate control switch block 210 outputs the H level notification signal PSW_ACK.

Based on the control information CI, the external control device 7 shifts the enable signals PSW_ENb for the time-sharing control switch block 290 from the L level to the H level at substantially the same timing.

For example, the signal levels of the enable signals PSW_ENb are set to the H level in synchronism with the timing when the notification signal PSW_ACK is set to the H level. The timing when the signal levels of the enable signals PSW_ENb are set to the H level may be different from the timing when the notification signal PSW_ACK is set to the H level.

As in the present operation example, such control of the time-sharing control switch block 290 that sets the plurality of switch sections 291 to the on state at one time does not depend on the notification signal PSW_ACK from the slew-rate control switch block 210.

Figure 11:
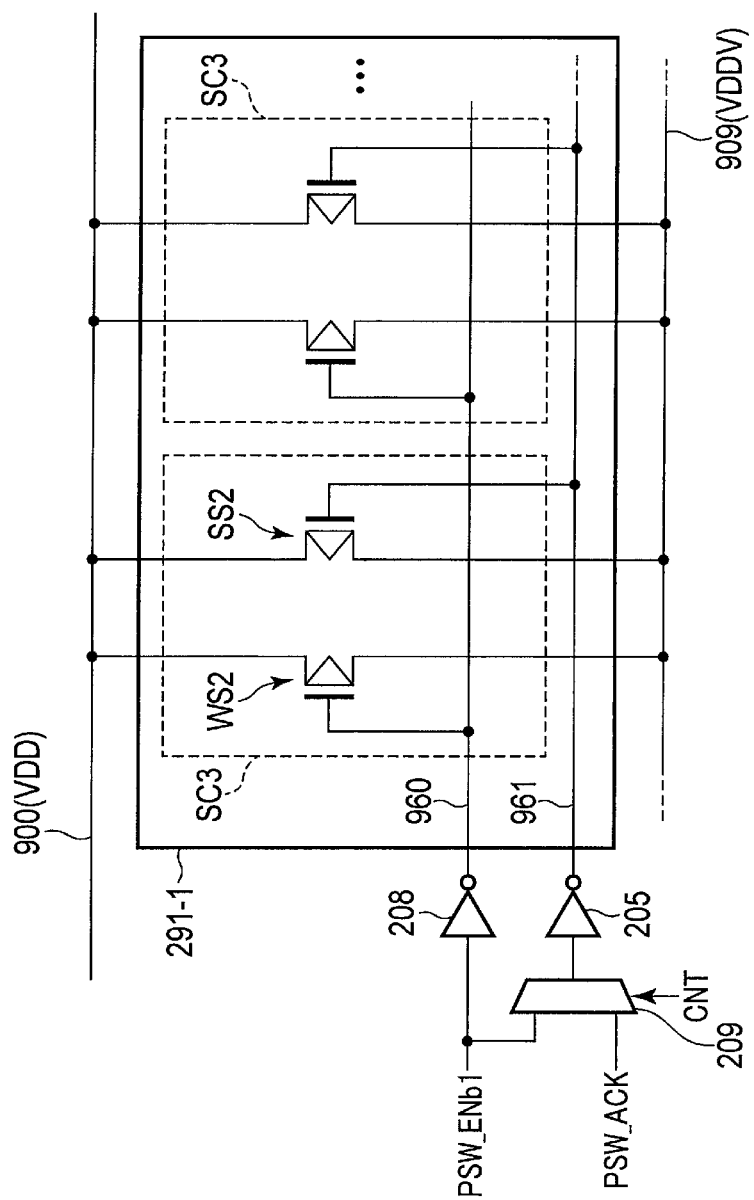
FIG. 11 is a schematic depicting a modification example of the switch circuit in the semiconductor integrated circuit of the embodiment.

FIG. 11 is an equivalent circuit diagram depicting a modification example of the power switch circuit in the present embodiment. As depicted in FIG. 11, to enable the external control device 7 to select the control signal supplied to the switch cells SC3 in the switch sections 291-1 and 291-2, a selector 209 to which the enable signal PSW_ENb and the notification signal PSW_ACK are supplied may be connected to an input section of the control signal line 961 (for example, connected to an upstream side of the inverter 205). The external control device 7 supplies a control signal (select signal) CNT to the selector 209. Thus, the selector selects one of the enable signal PSW_ENb1 and the notification signal PSW_ACK.

The above-described operation allows the power supply voltage VDD to be supplied to the power domain 190 (101 to 103) via the power switch circuit 20.

The LSI device of the present embodiment enables an operation of the LSI device different from the operation in FIG. 10, as depicted in FIG. 12.

An operation example of the LSI device of the present embodiment will be described using FIG. 12.

FIG. 12 is a timing chart illustrating an operation example of the LSI device of the present embodiment. FIG. 12 depicts timings for changes in control signals in the power switch circuit.

Driving of the slew-rate control switch block 210 may be started after driving of the time-sharing control switch block 290 is started. Such a method for controlling the power switch circuit 20 may be changed by allowing the external control device 7 to rewrite the control information CI using software (or firmware).

As depicted in FIG. 12, with the enable signal PSW_ENa maintained at the L level, the signal levels of the plurality of enable signals PSW_ENb1 to PSW_ENb5 are sequentially set to the H level. The plurality of switch sections 291 are sequentially activated at different timings. The power domain 190 is made electrically continuous with the power supply line 900 via the time-sharing control switch block 290 in the on state. The switch sections start supplying the power supply voltage (power) at different timings.

With the enable signal PSW_ENa maintained at the H level, the enable signal PSW_ENb is set to the H level. For example, the enable signal PSW_ENa is set to the H level substantially simultaneously with the timing when the enable signal PSW_ENb5 is set to the H level.

The weak switch WS1 and the strong switch SS1 in the slew-rate control switch block 210 are sequentially activated. Consequently, the power domain 190 is made electrically continuous with the power supply line 900 via the slew-rate control switch block 210 in the on state.

As described above, after the time-sharing control switch block 290 starts supplying the power supply voltage VDD, the slew-rate control switch block 210 starts supplying the power supply voltage VDD.

Based on the notification signal PSW_ACK from the slew-rate control switch block 210, the strong switches SS2 in the time-sharing control switch block 290 are activated.

The above-described operation allows the power supply voltage VDD to be supplied to the power domain via the power switch circuit 20.

The CPU and LSI device including the power switch circuit 20 driven by the operation illustrated in FIG. 12 produces effects substantially similar to the effects of the control (the operation of recovering the power domain) of the power switch circuit 20 driven by the operation illustrated in FIG. 8.

An operation example of the LSI device of the present embodiment will be described using FIG. 13.

FIG. 13 is a timing chart illustrating an operation example of the LSI device of the present embodiment. FIG. 13 illustrates timings for change in control signals in the power switch circuit.

For example, while the power domain is sleeping (in the off state), some of the switch elements in the power switch circuit 20 (for example, one or two switch sections) may be maintained in the on state as depicted in FIG. 13. For example, the enable signal PSW_ENb1 is normally set to the H level, with the switch elements in the switch section 291-1 set to the on state.

On the other hand, similar to FIG. 8, the enable signals PSW_ENa, and PSW_ENb2 to PSW_ENB5, for example, are set to the L level in the off state of the power domain, the switch elements corresponding to the enable signals PSW_ENa and PSW_ENb2 set to the off state. And then, when the power domain is recovered from the sleep state, the signal levels of the enable signals PSW_ENa and PSW_ENb2 to PSW_ENB5 are shifted from L level to H level in order.

The switch elements (switch sections) in the on state allows low power (for example, a small current) to be supplied, during a sleep operation, to the internal power supply line 909 through the power supply line 900, the internal power supply line 909 is weakly charged to the extent that the power domain 190 is not driven.

Thus, compared to a case where all the switch elements in the power switch circuit 20 are set to the off state during the sleep, the present embodiment allows the CPU and LSI device including the power switch circuit 20 driven by the operation illustrated in FIG. 13 to achieve an operation of quickly recovering (waking up) the power domain 190.

In the example in FIG. 13, the number of switch elements (switch sections) set to the on state in the sleep state is smaller than the number of switch elements set to the off state, so as to prevent the power domain 190 from being driven during the sleep. The number of switch elements set to the on state in the sleep state is preferably set so as to achieve a reduction in the power consumption in the power domain 190.

FIG. 13 illustrates an example of a method for controlling the power switch circuit 20 depicted in FIG. 8 in which some of the switch elements (switch sections) are on while the power domain 190 is in the off state. However, in the method for controlling the power switch circuit 20 in FIG. 10 and FIG. 12, some of the switch elements (switch sections) may be turned on while the power domain 190 is sleeping in order to achieve an operation of quickly recovering the power domain 190.

When the control information CI for the power switch circuit 20 is rewritten via software, the operation of the power switch circuit 20, including the switch block 210 and 290 based on the different control schemes, can be flexibly changed in accordance with the user's specifications or the standards/design for the LSI device, without the need to significantly change the internal configuration of the power switch circuit 20.

As a result, the LSI device of the present embodiment enables the enhancement of flexibility of design for system LSI, a reduction in design period for the LSI device and the semiconductor system, and a reduction in manufacturing costs for the LSI device and the semiconductor system.

Other Embodiments

The switch circuit 20 included in the semiconductor integrated circuit in the above-described embodiments is applicable to devices other than the CPU, for example, an image sensor and a semiconductor memory.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a voltage line to which a first voltage is applied;
   a first circuit configured to operate by using the first voltage; and
   a second circuit configured to control a connection between the voltage line and the first circuit;
   wherein the second circuit includes:
   at least one first switch circuit including a plurality of first switch cells; and
   a second switch circuit including a plurality of switch sections,
   the plurality of first switch cells are configured to connect the first circuit and the voltage line based on a first control signal,
   the plurality of switch sections are configured to connect the first circuit and the voltage line based on a plurality of second control signals different from the first control signal, the first switch circuit outputs a third control signal after the plurality of first switch cells are sequentially turned on, and a first switch section of the plurality of switch sections is turned on based on the third control signal and a first signal of the plurality of second control signals.

2. The semiconductor device according to claim 1, wherein the third control signal indicates that the connection between the first circuit and the voltage line via the first switch circuit is complete.

3. The semiconductor device according to claim 1, wherein the first switch circuit generates the third control signal based on the first control signal.

4. The semiconductor device according to claim 1, wherein each of the plurality of second control signals is asserted at different timings, and each of the plurality of switch sections is set to an on state at different timings based on the plurality of second control signals.

5. The semiconductor device according to claim 1, wherein the plurality of second control signals is asserted at an identical timing, and
the plurality of switch sections is set to an on state at an identical timing based on the plurality of second control signals.

6. The semiconductor device according to claim 1, wherein, during a period when the first circuit is set to a non-operating state,
the first switch circuit is turned off, and
at least one of the plurality of switch sections are turned on, and remaining switch sections are turned off.

7. The semiconductor device according to claim 1, wherein
at least one of the plurality of first switch cells includes a first switch element and a second switch element being controlled by the first control signal,
the second switch element is turned on after the first switch element is turned on, and
a driving force of the second switch element is larger than a driving force of the first switch element.

8. The semiconductor device according to claim 1, wherein the first switch section includes at least one second switch cell,
the second switch cell includes a third switch element being controlled by the first signal and a fourth switch element being controlled by the third control signal,
the fourth switch element is turned on after the third switch element is turned on, and
a driving force of the fourth switch element is larger than a driving force of the third switch element.

9. The semiconductor device according to claim 1, wherein
the first switch section includes at least one second switch cell,
a second switch section of the plurality of switch sections includes at least one third switch cell,
the plurality of the first switch cells are sequentially turned on in a first period extending from a first time instant to a second time instant,
the second switch cell is turned on at a third time instant different from the first and second time instants in the first period, and
the third switch cell is turned on at a fourth time instant different from the first, second and third time instants in the first period.

10. A semiconductor system comprising:
a semiconductor device including a voltage line to which a first voltage is applied, a first circuit configured to operate by using the first voltage, and a second circuit configured to control a connection between the voltage line and the first circuit; and
a controller configured to control the semiconductor devices,
wherein the second circuit includes:
at least one first switch circuit including a plurality of first switch cells; and
a second switch circuit including a plurality of switch sections,
the plurality of first switch cells are configured to connect the first circuit and the voltage line based on a first control signal,
the plurality of switch sections are configured to connect the first circuit and the voltage line based on a plurality of second control signals different from the first control signal,
the first switch circuit outputs a third control signal after the plurality of first switch cells are sequentially turned on, and
a first switch section of the plurality of switch sections is turned on based on the third control signal and a first signal of the plurality of second control signals.

11. The semiconductor system according to claim 10, wherein each of the plurality of second control signals is asserted at different timings, and
each of the plurality of switch sections is set to an on state at different timings based on the plurality of second control signals.

12. The semiconductor system according to claim 10, wherein the plurality of second control signals is asserted at an identical timing, and
the plurality of switch sections is set to an on state at an identical timing based on the plurality of second control signals.

13. The semiconductor system according to claim 10, wherein, during a period when the first circuit is set to a non-operating state,
the first switch circuit is turned off, and
at least one of the plurality of switch sections are turned on, and remaining switch sections are turned off.

14. The semiconductor system according to claim 10, wherein
at least one of the plurality of first switch cells includes a first switch element and a second switch element being controlled by the first control signal,
the second switch element is turned on after the first switch element is turned on, and
a driving force of the second switch element is larger than a driving force of the first switch element.

15. The semiconductor system according to claim 10, wherein the first switch section includes at least one second switch cell,
the second switch cell includes a third switch element being controlled by the first signal and a fourth switch element being controlled by the third control signal,
the fourth switch element is turned on after the third switch element is turned on, and
a driving force of the fourth switch element is larger than a driving force of the third switch element.

16. The semiconductor system according to claim 10, wherein the controller includes control information to control the first and second switch circuits.

17. The semiconductor device according to claim 1, wherein a second switch section of the plurality of switch sections is turned on based on only a second signal of the plurality of second control signals.

18. The semiconductor system according to claim 10, wherein
a second switch section of the plurality of switch sections is turned on based on only a second signal of the plurality of second control signals.

19. The semiconductor device according to claim 8, wherein
a second switch section of the plurality of switch sections includes at least one third switch cell,
the third switch cell includes a fifth switch element being controlled by a second signal of the plurality of second control signals, and
a driving force of the fifth switch element is smaller than the driving force of the fourth switch element.

20. The semiconductor device according to claim 15, wherein
a second switch section of the plurality of switch sections includes at least one third switch cell,
the third switch cell includes a fifth switch element being controlled by a second signal of the plurality of second control signals, and
a driving force of the fifth switch element is smaller than the driving force of the fourth switch element.

* * * * *